United States Patent
Ekstedt et al.

(10) Patent No.: US 9,282,682 B2
(45) Date of Patent: Mar. 8, 2016

(54) HEAT CONDUCTING MOUNTING STRUCTURE, METHOD AND RADIO BASE STATION HOUSING ARRANGEMENT FOR MOUNTING ELECTRONIC MODULES

(75) Inventors: Ulf Ekstedt, Saltsjöbaden (SE); Mikael Johansson, Mölnlycke (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 523 days.

(21) Appl. No.: 13/517,959

(22) PCT Filed: Dec. 23, 2009

(86) PCT No.: PCT/SE2009/051495
§ 371 (c)(1),
(2), (4) Date: Jul. 5, 2012

(87) PCT Pub. No.: WO2011/078754
PCT Pub. Date: Jun. 30, 2011

(65) Prior Publication Data
US 2012/0285003 A1 Nov. 15, 2012

(51) Int. Cl.
*H01S 4/00* (2006.01)
*H05K 7/20* (2006.01)

(52) U.S. Cl.
CPC ........ *H05K 7/20681* (2013.01); *H05K 7/20536* (2013.01); *Y10T 29/49002* (2015.01); *Y10T 29/4935* (2015.01)

(58) Field of Classification Search
CPC .......... H05K 7/20536; H05K 7/20218; H05K 7/20681; H05K 7/20636; Y10T 29/49002; Y10T 29/4935
USPC ............... 29/592.1, 890.03; 165/679.47, 700, 165/687, 695, 694, 699, 696, 67, 104.33, 165/80.4; 361/67, 104.33, 80.4, 679.47, 361/700, 687, 695, 694, 699, 696; 702/182
See application file for complete search history.

(56) References Cited

U.S. PATENT DOCUMENTS 4,226,281 A * 10/1980 Chu .................... H01L 23/4338
165/185
4,793,405 A    12/1988 Diggelmann et al.
(Continued)

FOREIGN PATENT DOCUMENTS

| EP | 1328022 A2 | 7/2003 |
|---|---|---|
| EP | 1853097 A2 | 11/2007 |
| WO | 2005101938 A1 | 10/2005 |

*Primary Examiner* — Peter DungBa Vo
*Assistant Examiner* — Azm Parvez
(74) *Attorney, Agent, or Firm* — Patent Portfolio Builders, PLLC

(57) ABSTRACT

Heat conducting mounting structure for mounting of electronic modules, comprising first surface area that is adapted to face a second surface area of the electronic module; cavity means embedded at a distance from the first surface area; said cavity means is adapted to receive a cooling means; attachment means at the first surface area adapted for attaching the electronic module; and wherein the attachment means is adapted for a transfer of the heat energy from the electronic module to the mounting structure. Further a method for mounting the electronic module on the heat conducting mounting comprising the step of adjoining an attachment means with a fixing means and the fixing means with the electronic module to obtain at least one immediate connection pressure area between the first surface area of a wall and the second surface area of the electronic module. Also a radio base station housing arrangement is provided.

19 Claims, 16 Drawing Sheets

(56) References Cited

U.S. PATENT DOCUMENTS

| | | | | |
|---|---|---|---|---|
| 5,504,924 A | * | 4/1996 | Ohashi | F28D 15/0233 361/676 |
| 6,026,565 A | * | 2/2000 | Giannatto | H05K 7/1424 165/104.33 |
| 6,088,225 A | | 7/2000 | Parry et al. | |
| 7,149,086 B2 | * | 12/2006 | Faneuf | H01L 23/427 165/104.33 |
| 7,212,409 B1 | * | 5/2007 | Belady | G06F 1/20 361/721 |
| 7,706,143 B2 | | 4/2010 | Lang et al. | |
| 2002/0117291 A1 | * | 8/2002 | Cheon | G06F 1/20 165/80.4 |
| 2002/0159233 A1 | | 10/2002 | Patel et al. | |
| 2004/0008483 A1 | * | 1/2004 | Cheon | G06F 1/20 361/679.53 |
| 2009/0218072 A1 | * | 9/2009 | Eriksen | H01L 23/473 165/80.2 |

* cited by examiner

HEAT CONDUCTING MOUNTING STRUCTURE, METHOD AND RADIO BASE STATION HOUSING ARRANGEMENT FOR MOUNTING ELECTRONIC MODULES

TECHNICAL FIELD

The invention relates to packaging and heat conduction management of electronic modules in telecommunication field; and more particularly to a heat conducting mounting structure for mounting of electronic modules; to a method for mounting of electronic modules and a radio base station housing arrangement.

BACKGROUND

For electronics industry, the Moore's law only forecasts for an increased packaging density of gates for electronic devices, and nothing about reducing power dissipation per gate. Even if lots of effort is placed in reducing per-gate consumption, it is not done in the same rate for the packaging density. The consequence is that the power dissipation and the cooling need per volume electronic unit increase substantially.

The industry faces numerous problems with the cooling of electronics such as Radio Base Stations, Network Servers, Work stations, and High-power rectifiers etc. Today's electronics is usually cooled with forced air or water-cooled solutions. The disadvantages with forced cooling are numerous such as (a) an extra heat exchanger is needed since outdoor air can not be used directly i.e. to avoid dust, humidity etc.; (b) air channels take extra volume and add costs due to increased mechanical setups; (c) power consuming internal air fans; (d) dummy modules are required for controlling the air flow when systems are not fully equipped and (e) dimensioning of cooling capacity per module is directly connected to volume. That means that small power-consuming modules must have higher volume in order get enough cooling. The effect is also the same in the other direction with low-power, but volume demanding modules. These modules get more cooling capacity allocated to them than they actually need.

In U.S. Pat. No. 4,793,405-A, a condenser is connected at the top to a riser and at the bottom to a downpipe. Below the condenser, a vertically disposed, plate-shaped element is arranged, there being formed along the two vertical edges of this element the conduits and, between these, several evaporators, separated from one another by perforations, for transferring the heat loss of the electrical elements to a liquid. Each of the evaporators is connected at one end at the top with the riser and at the opposite end at the bottom with the downpipe. The condenser, the conduits, and the evaporators constitute a unit sealed in a pressure-proof fashion which is filled with the liquid, that can be evaporated in the evaporators by the heat loss and can be condensed in the condenser, to such an extent that the liquid volume lies above the uppermost evaporator and below the condenser or in the lower portion of the latter. The element forms the rear wall of an electronic equipment rack, each evaporator being in heat-conductive connection with the electrical elements arranged in a tier of the rack.

In US2006005980A1, a thermal energy management system is provided having a heat spreading device that is operatively engaged with at least one semiconductor chip and a thermal bus operatively engaged with the heat spreading device so as to transport thermal energy from the heat spreading device to a heat sink. The heat spreading device includes a heat pipe and the thermal bus includes a loop thermosyphon. A second thermal bus may be operatively engaged with the first-thermal bus so as to transport thermal energy from the first thermal bus to a heat sink. The second thermal bus may also include a loop thermosyphon. A method of managing thermal energy in an electronic system is also provided that includes spreading thermal energy generated by one or more devices over a surface that is relatively larger than the devices, thermally coupling an evaporator portion of a loop thermosyphon to the surface, and thermally coupling a condensing portion of the loop thermosyphon to a thermal energy sink, e.g., a second loop thermosyphon, convection fin, or cold plate.

Thus the major problems with above mentioned prior art is that the cooling systems are (a) expensive infrastructure; (b) difficult plumbing on system and module level and (c) difficult connector-to-module connections that take time to assemble and also are a potential leakage source of cooling media such as fluorohydrocarbons etc.

SUMMARY

An object of the invention is to enable a system that is compact with minimum of parts, easy to assemble and has efficient heat transfer properties.

In an aspect of the invention, a heat conducting mounting structure is provided for mounting of at least one electronic module, said mounting structure comprising
  at least one first surface area of a wall, the first surface area is adapted to face a second surface area of the electronic module;
  at least one cavity means embedded in the wall, the cavity means being placed at a distance from the first surface area; said cavity means being adapted to receive a cooling means;
  at least one attachment means at the first surface area adapted for attaching the electronic module; and
  wherein the attachment means is adapted for a transfer of the heat energy from the electronic module to the mounting structure.

In an embodiment the first surface area is arranged so as to be substantially parallel to the second surface area.

In an embodiment the first surface area is arranged so as to be substantially planar to the second surface area.

In an embodiment the first surface area is arranged so as to be ridged or corrugated.

In an embodiment the attachment means is positive or negative recesses adapted to receive the electronic module.

In an embodiment the attachment means is a cylindrical cavity having
  a threaded surface area around an axial of the cylindrical cavity;
  an opening toward the first surface area of the wall;
the cylindrical cavity is adapted to receive a fixing means via the opening; wherein the fixing means is fitted around the axial, and is resiliently retained by the threaded surface area of the cylindrical cavity.

In an embodiment at least one fixing means configured to connect with the attachment means.

In an embodiment the fixing means is a rivets attachable to the electronic module.

In an embodiment the fixing means is a clamp or a screw or a hook or a quarter-turn screw.

In an embodiment the fixing means is adapted to engage the second surface area onto the first surface area.

In an embodiment a connection between the attachment means and the fixing means is arranged so as to create an immediate connection pressure area between the first and second surface area for a transfer of the heat energy from the electronic module to the mounting structure.

In an embodiment the cavity means is a cylindrical tube.

In an embodiment the first surface area is arranged substantially vertical.

In an embodiment the cooling means is a thermosyphon loop comprising a cooling device and a cooling material adapted to circulate in the cavity means, the cooling material being adapted to be cooled by the cooling device.

In an embodiment the cooling device is an electric fan.

In an embodiment the surface area is a thermal conductive material.

In an embodiment the thermal conductive material is an extruded aluminium or an extruded copper or an iron-nickel compound or a graphite material.

An aspect of the invention relates to a method for mounting at least one electronic module on the heat conducting mounting structure, the method comprising the step of adjoining an attachment means with a fixing means and the fixing means with the electronic module to obtain at least one immediate connection pressure area between a first surface area of the heat conducting mounting structure and a second surface area of the electronic module.

The method may comprise the step of inserting a heat conducting mounting structure from a top opening of a radio base station housing.

The method may comprise the step of attaching the electronic module to the heat conducting mounting structure before the heat conducting mounting structure is inserted into the radio base station housing.

In an aspect of the invention, a radio base station housing arrangement is provided, comprising
  a radio base station housing,
  a heat conducting mounting structure mentioned above;
  an electronic module for a radio base station or a network server or work-station or a high-power rectifier or a circuit board with an electro-magnetic configuration; wherein
    the electronic module is adapted to mount on the heat conducting mounting structure as mentioned above.

In an embodiment the radio base station comprises an opening in a top portion of the radio base station housing.

In an embodiment of the radio base station a second surface area is adapted to engage with a first surface area via a thermal interface material.

In an embodiment of the radio base station, the electronic module is adapted to engage with a first surface area via a printed circuit board.

In an embodiment of the radio base station, the printed circuit board is adapted to engage with the first surface area via the thermal interface material.

BRIEF DESCRIPTION OF THE DRAWINGS

FIG. 15b shows an alternate embodiment of the FIG. 15a.

DETAILED DESCRIPTION

Figure 1:
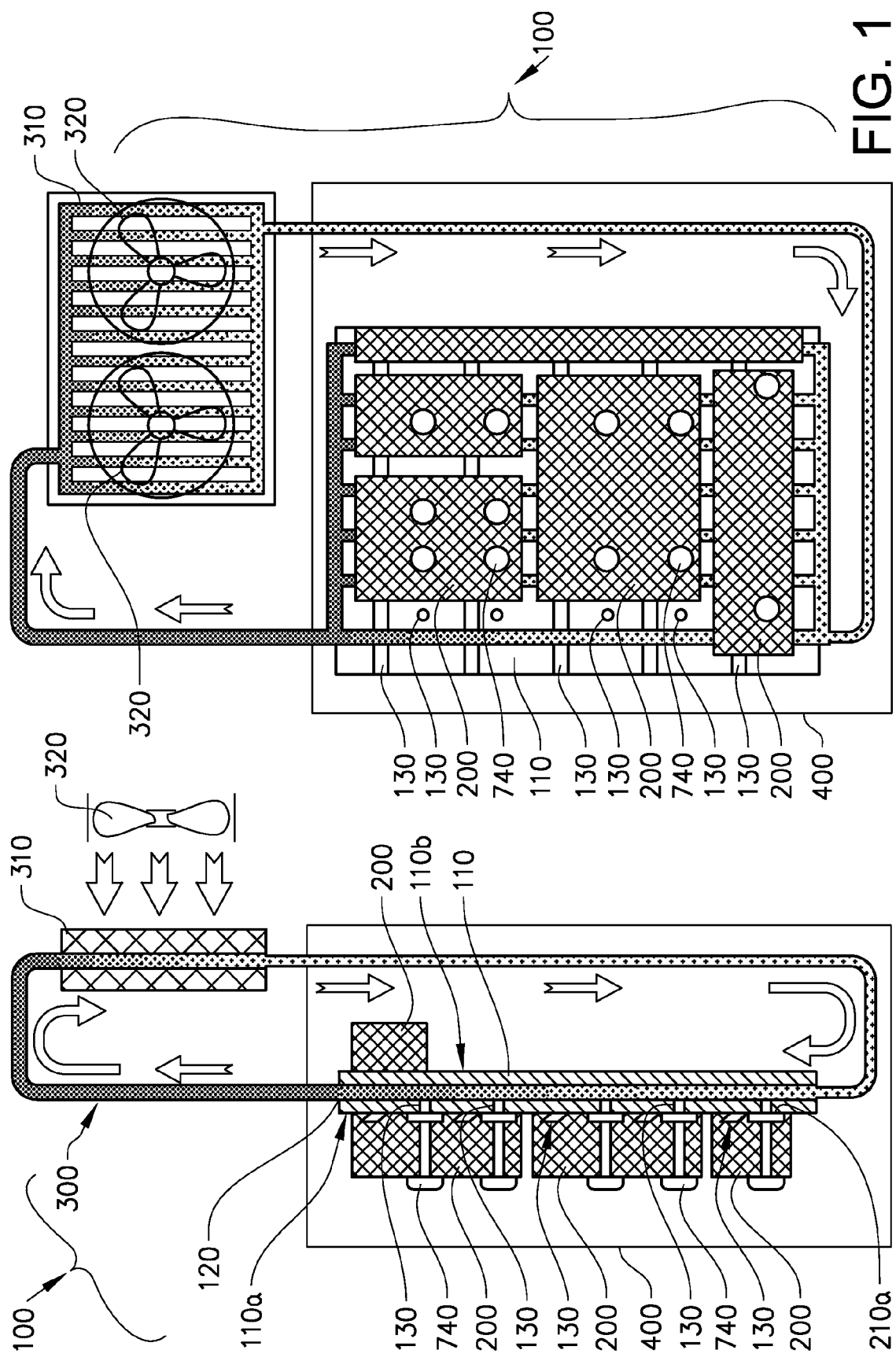
FIG. 1 shows an embodiment of a mounting structure.
Figure 11B:
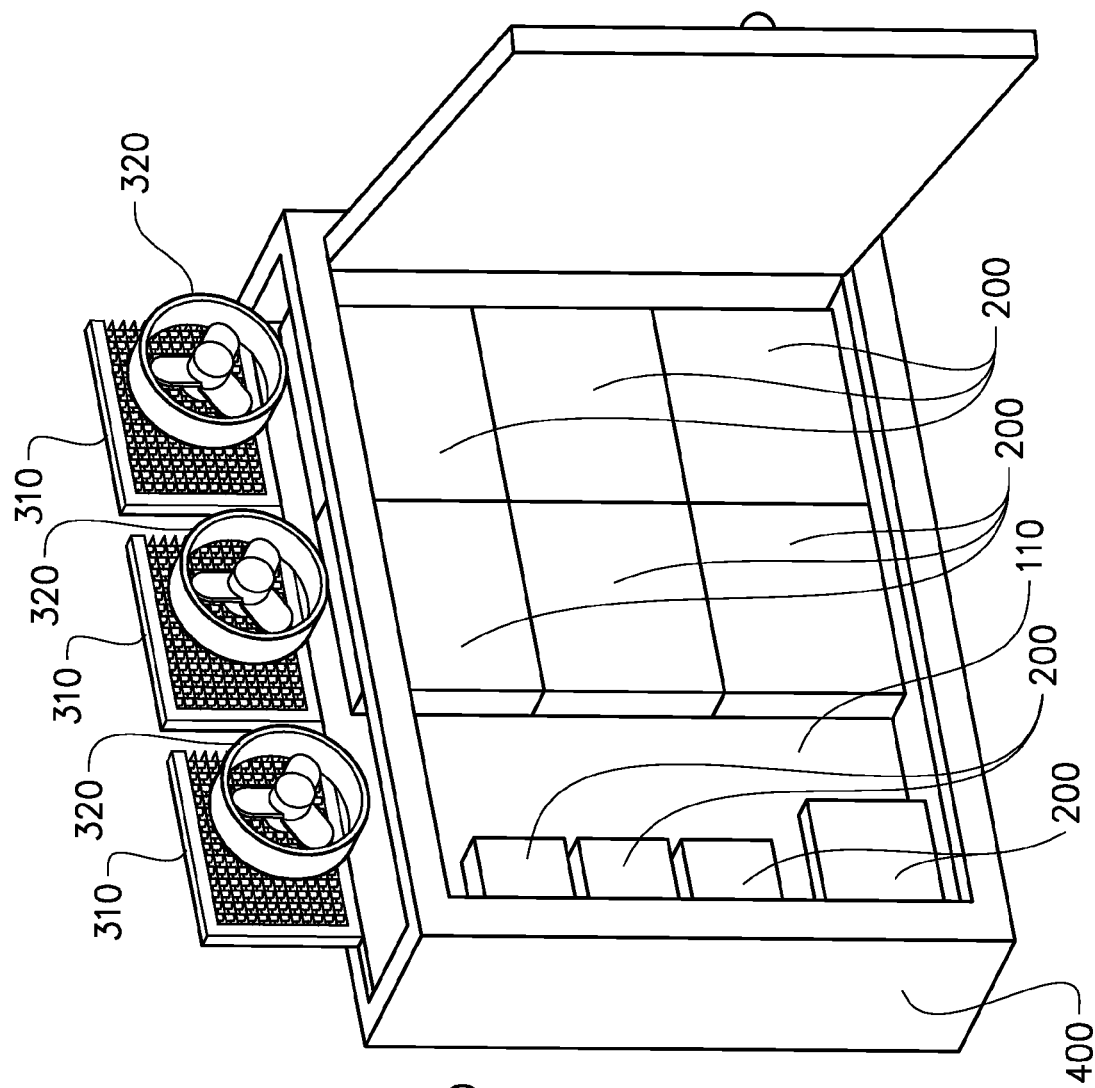
FIG. 11b shows an alternative embodiment of attaching the electronic module on the wall and as well a radio base station housing arrangement.
Figure 14:
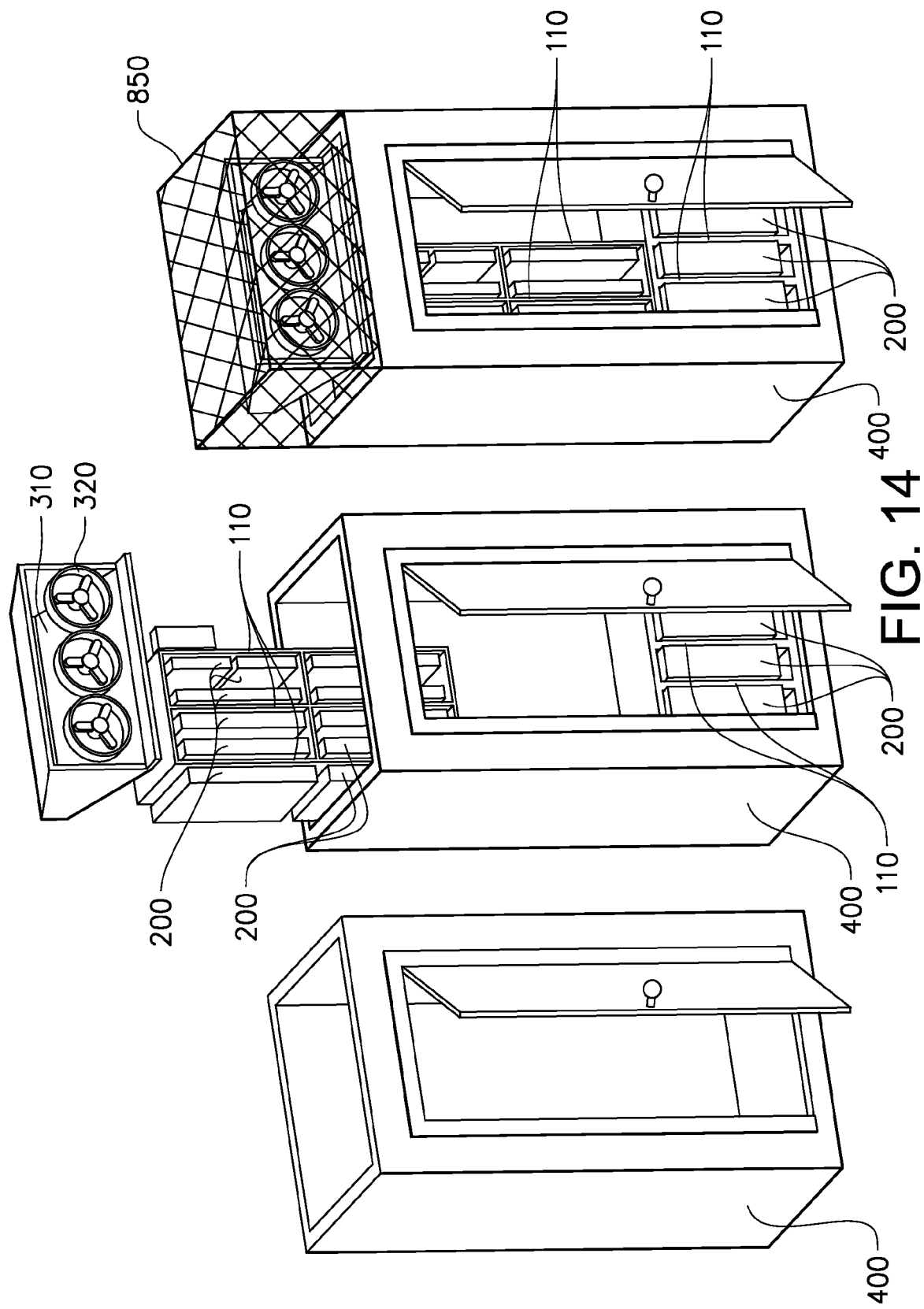
FIG. 14 shows an alternate embodiment for the radio base station housing arrangement.
Figure 16:
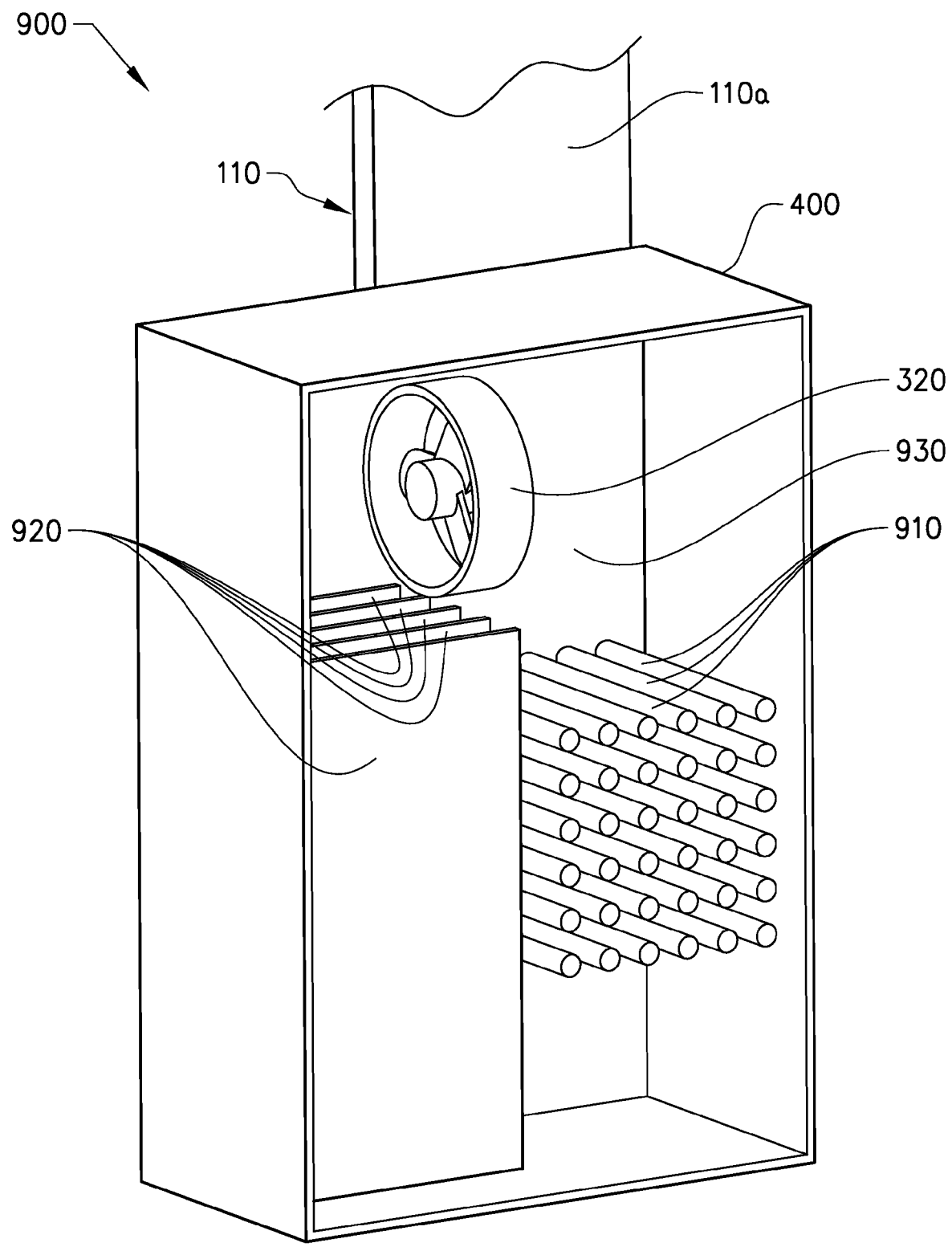
FIG. 16 shows another embodiment with the cooling device is situated inside the radio base station housing arrangement.

A heat conducting mounting structure 100 is presented for mounting of at least one electronic module 200. Hereafter in the description the heat conducting mounting structure 100 is call the mounting structure 100. The mounting structure 100 comprises an attachment means 130 contiguously arranged to a wall 110, which is adapted for a transfer of heat energy from the electronic module 200 to the mounting structure 100 as shown in FIG. 1. Further a radio base station housing arrangement (RBS-H) 400 comprising the mounting structure 100 and electronic module 200 is presented as shown in FIG. 11b, FIG. 14 and FIG. 16. Furthermore a method for mounting the electronic module 200 on the mounting structure 100 is presented. Furthermore a method for assembly of the RBS-H 400 is presented in conjunction with description related to FIG. 9, 11b, FIG. 14 and FIG. 16.

A left part and a right part of the FIG. 1 respectively shows side and front view of an embodiment of the electronic module 200 mounted on the mounting structure 100. Different configurations of mounting the electronic module 200 on the mounting structure 100 will be described in detail below. In an embodiment, the mounting structure 100 comprises the wall 110 with at least one first surface area 110a; the first surface area 110a is adapted to face a second surface area 210a of the electronic module 200. The mounting structure 100 further comprises at least one cavity means 120 embedded at a distance dc (shown in FIG. 2) from the first surface area 110a. The cavity means 120 is adapted to receive a cooling means 300 which will be described later on in exemplary embodiments. The mounting structure 100 further comprises the attachment means 130 at the first surface area 110a adapted for attaching the electronic module 200; and wherein the attachment means 130 is adapted for a transfer of the heat energy from the electronic module 200 to the mounting structure 100. Different adaptations of the attachment means 130 will be explained in embodiments later on in the description i.e. related to FIG. 2-9. In FIG. 1, two different embodiments of the attachment means 130 are shown e.g. multiple open-ended recesses 111a described in conjunction with description related to FIG. 2 and multiple bores/cavities e.g. cylindrical cavity 760 are described in conjunction with description related to FIG. 7, FIG. 8 and FIG. 9.

In an embodiment, the first surface area 110a of the wall 110 is arranged substantially vertical. In the above exemplary embodiment shown in FIG. 1, further the wall 110 is substantially planar as shown in FIG. 2 i.e. for facing the electronic module 200.

Figure 3:
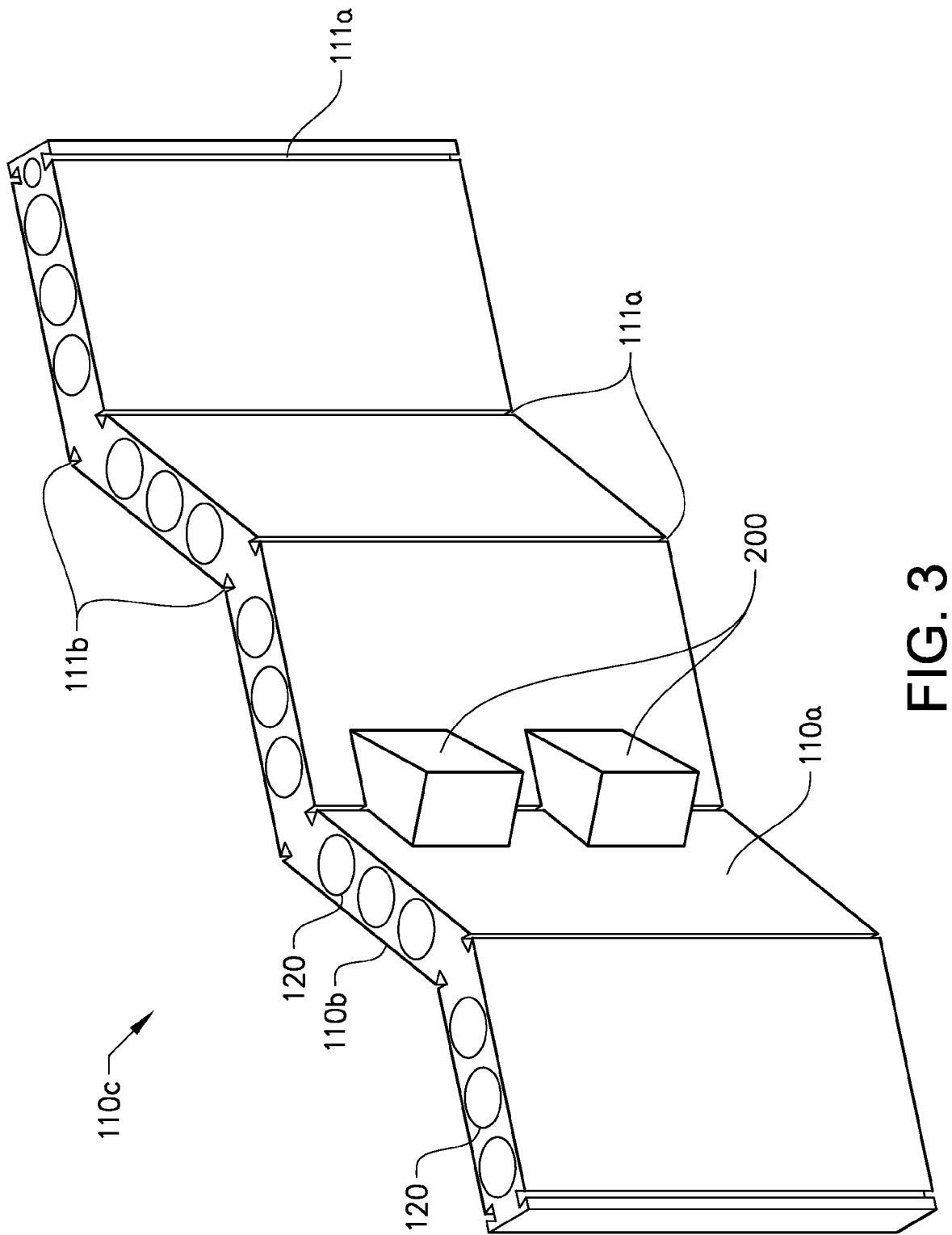
FIG. 3 shows an alternate embodiment of the wall.

In another embodiment, the wall 110c has the first surface area 110a and the second surface area 210a may be arranged so as to be a ridged or corrugated with substantially the same surface shape with respect each other so as to fit each other as shown in FIG. 3. This provides a larger surface area of contact between the first surface area 110a and the second surface area 210a than in embodiments where the first surface area 110a and the second surface area 210a are in alignment/plane with respect to each other. The shape of the first surface area 110a and second surface area 210a may be configured to fulfill the criterion that the first surface area 110a is arranged so as to be substantially parallel with respect to the second surface area 210a.

The ability of conducting heat is dependent on the plain/flat or corrugated contact areas of the wall 110 to the electronic module 200. The first surface area 110a of the wall 110 is a thermal conductive material such as extruded aluminium or an extruded copper or an iron-nickel compound or graphite material. Typical dimensions for the wall 110 comprising cavity means 120 are height=750 mm, width=300 mm and wall depth=15 mm. Other dimension values may be substituted i.e. to accommodate placement of the wall 110 into the RBS-H 400. The wall 110 replaces the plug-in modules in the sub-rack/shelves mechanics of a conventional system. The wall 110 will be the only item that keeps the electronic modules 200 in place.

Figure 2:
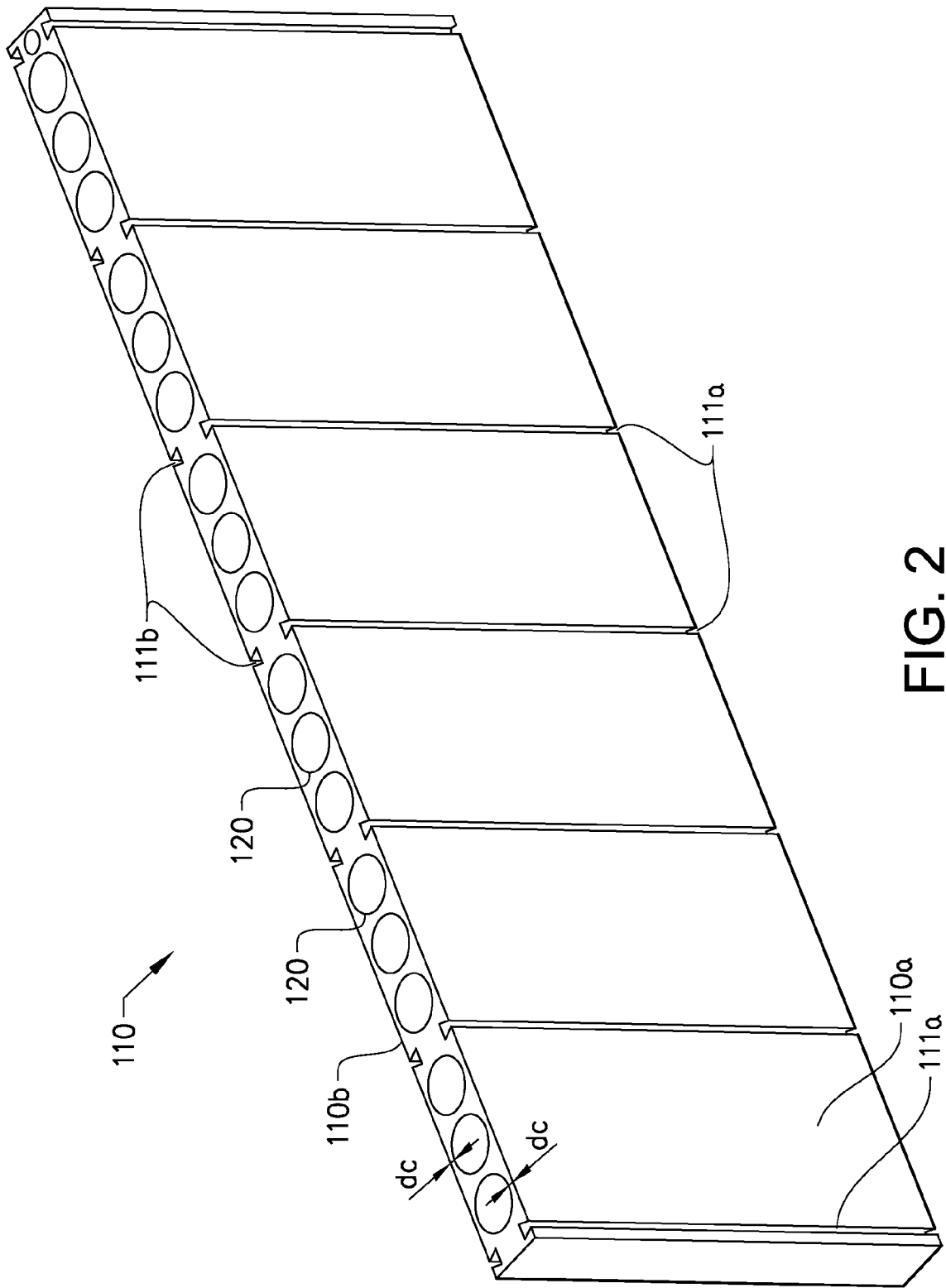
FIG. 2 shows a wall according to an embodiment of the invention.

In an embodiment, the wall 110, 110c incorporates the attachment means 130 that may be at least one vertical, that is when the wall is mounted vertically, recess/groove 111a adapted to receive the electronic modules 200 shown e.g. in FIG. 2 and FIG. 3. The vertical recess 111a, 111b may exist on the first surface area 110a, and/or on a back surface area 110b of the wall 110. The vertical recess 110a can be triangularly shaped, with one edge of the recess 111a facing the first surface area 110a being open ended and forming a half-open cavity. The vertical recess 111a may have length smaller than the height of the wall 110, so as a solid bottom of the half-open cavity functions as a stop member adapted to vertically secure the electronic modules 200. In another embodiment, the wall 110 may contain at least one vertical elongated protrusion/rib for mounting of the electronic modules 200. In another embodiment, the wall 110 may have horizontal recesses e.g. as alternate embodiment of attachment means 130 shown in FIG. 4. In another embodiment the attachment means 130 can be horizontal ribs (not shown in Figures). In another embodiment, the attachment means 130 is a cylindrical cavity having a threaded surface area around an axial of the cylindrical cavity; further the cylindrical cavity has an opening toward the first surface area 110a of the wall 110. The cylindrical cavity may be a threaded bore, as schematically shown as attachment means 130 in left part and right part of FIG. 1. In another embodiment, the attachment means 720a, 720b comprises e.g. the cylindrical cavity 760 shown in detail in FIG. 7 and FIG. 8. In alternate embodiment, the attachment means 130 may be part of the wall 110 and has a surface area that forms the threaded surface area.

The electronic modules 200 can be locked onto the wall 110 with screws or a quick locking mechanism. In an embodiment, at least one fixing means is configured to connect with the attachment means 130. The fixing means can be either rivets or recesses or protrusion or flange attachable to the electronic module 200. These fixing means mate respectively with either the recesses 111a or the ribs described earlier in conjunction with embodiments in FIG. 2. This mating between the attachment means 130 and the fixing means may be a force fit creating a contiguous connection. In another embodiment, the fixing means is a clamp or a screw or an expanding hook or a quarter-turn screw. These screws have both the purpose of keeping the electronic module 200 in place and to press and create a thermal interface to the wall 110. Further the fixing means are adapted to engage the second surface area 210a of the electronic module 200 onto a first surface area 110a of the wall 110 as will be described in coming embodiments.

Different arrangements for mounting the electronic module 200 on the mounting structure 100 exist. In an embodiment 500 disclosed in FIG. 4, the first surface area 110a has the attachment means 130 in that there are two open-ended recesses 111a arranged horizontally and further at a second distance dr from each other. The electronic module 200 has two fixing means 211 fixable on the second surface area 210a arranged similarly at the second distance dr from each other such as they can be guided into one each of the two recesses 111a either from one of the two end openings of the two recesses 111a on the wall 110. The fixing means 211 has a width and depth such as that it can substantially only move laterally inside the respective recess 111a. For example the fixing means 211 can be a rod with a triangular shaped surface area and a length less than e.g. to the area/length of the recess 111a. The triangular shaped surface area of the fixing means 211 is just big enough for lateral movement within the negative recesses 111a. The fixing means 211 may have a tapered ends e.g. wedge shaped, 211a, 211b and a hallow middle which runs throughout the length of the fixing means 211 so as to provide a through-hole in the fixing means. The hallow middle of the fixing means 211 adapts the fixing means 211 to receive a first fastening rod 213. Once the fixing means 211 is inside the recesses 111a, two wedge shaped fasteners 212a, 212b are adapted to engage/abut the two tapered inclined shaped ends 211a, 211b. The wedge shaped fasteners 212a, 212b have a second hallow middle which adapts the wedge shaped fasteners 212a, 212b to receive the first fastening rod 213. Firstly the fixing means 211 is mounted on the first fastening rod 213 via the hallow middle and further entered into the recesses 111a. Secondly the wedge shaped fasteners 212a, 212b are mounted on the first fastening rod 213 and are contiguously touching the tapered inclined shaped ends 211a, 211b; a bolting means 216 e.g. a nut can be used to fasten the fixing means 211 with the wedge shaped fasteners 212a, 212b coupled via an opening 115 on side walls of the mounting structure 100. The first fastening rod 213 is provided with threads on its outer surfaces on its both ends. The threads on the first fastening rod 213 are adapted to receive the bolting means 216 e.g. the nut with threaded bore. Thus the fixing means 211 is adapted to transfer heat from the electronic module 200 to the attachment means 130.

Figure 5:
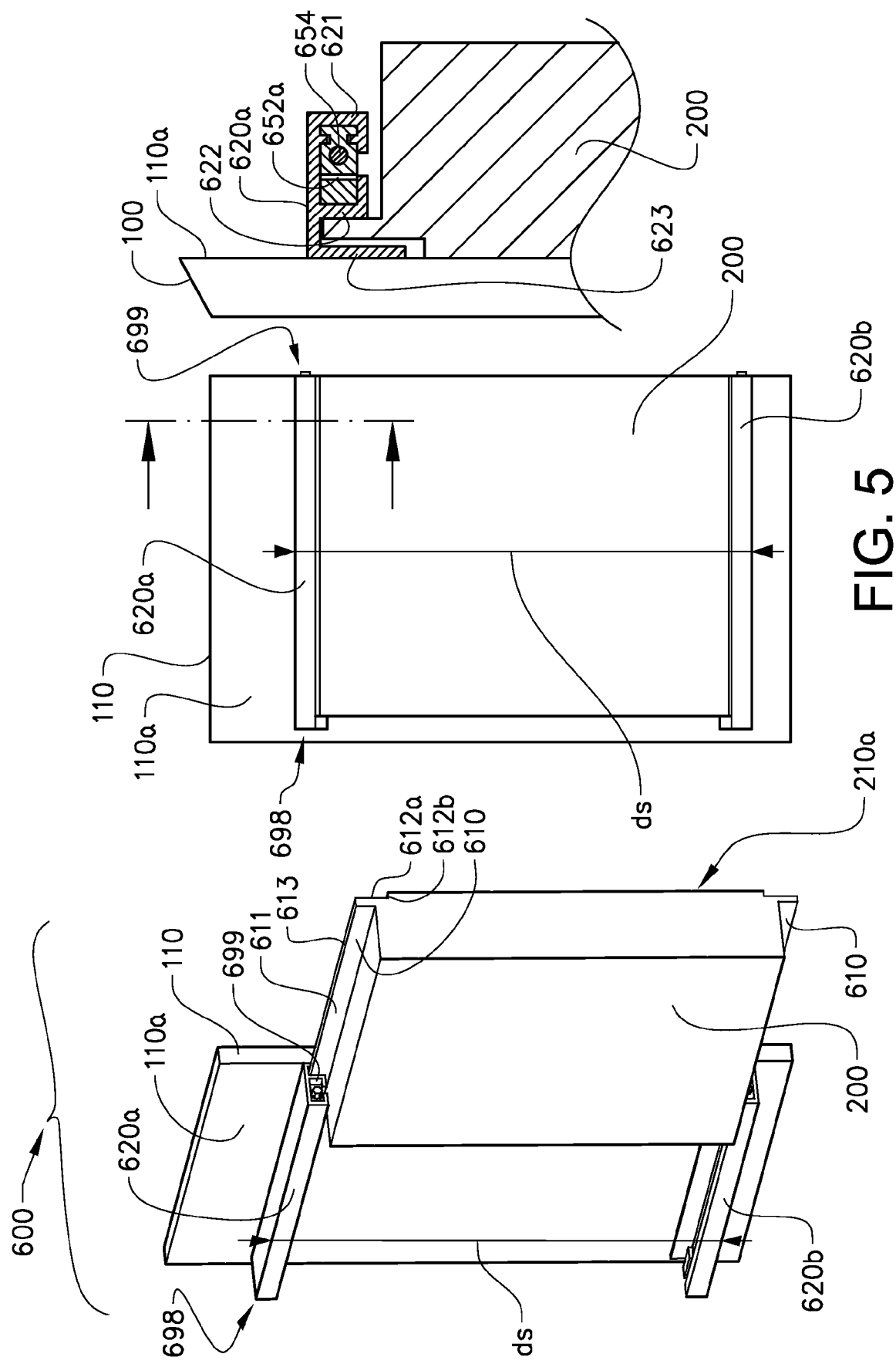
FIG. 5 shows an alternate embodiment of the wall with the attachment means and the fixing means configuration.
Figure 6:
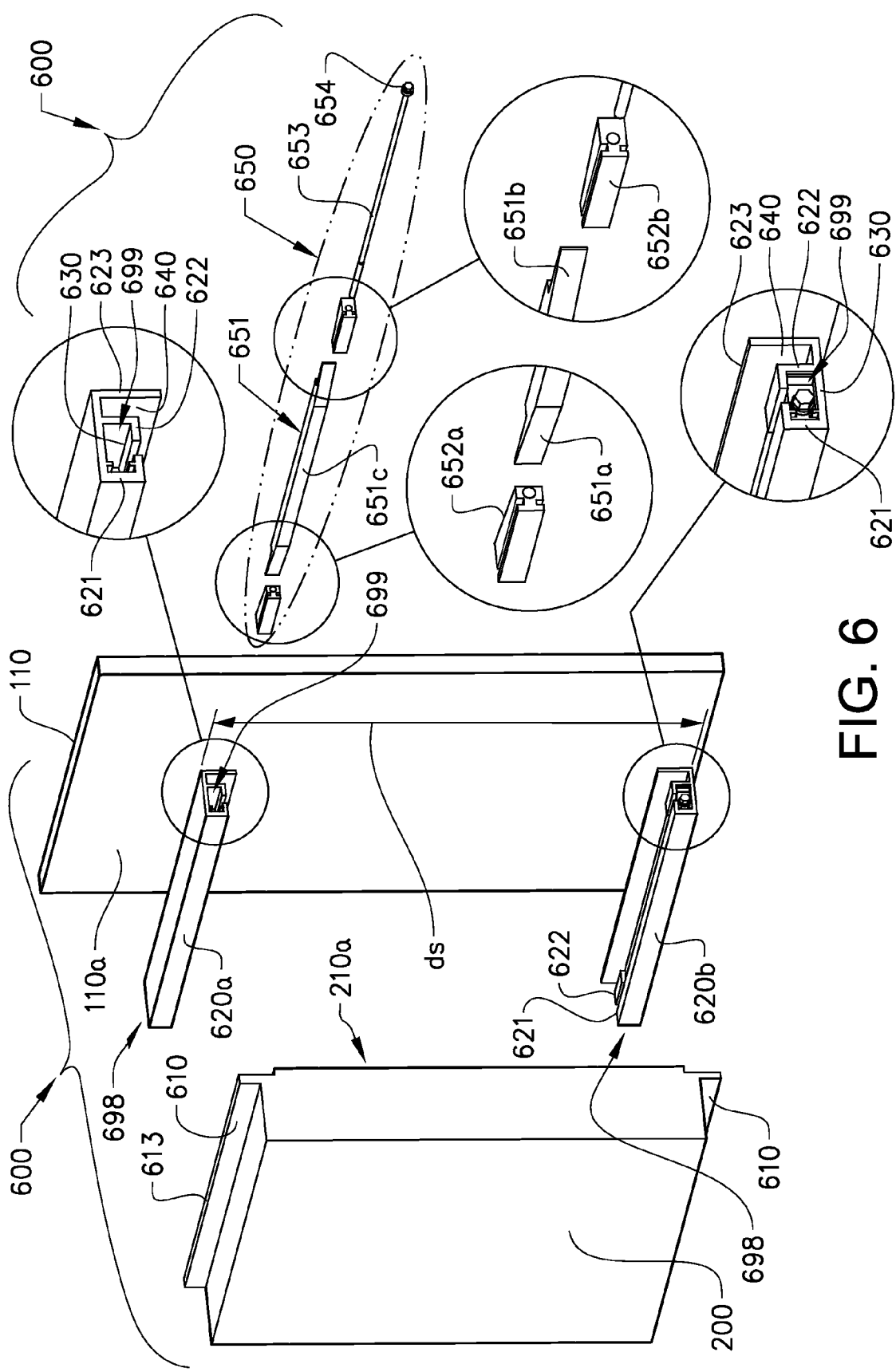
FIG. 6 shows a more detailed layout of the embodiment in FIG. 5.

In another embodiment 600 shown in FIG. 5, the electronic module 200 may have to two fin shaped ends or flanges 610. The flanges 610 can be horizontal shaped as shown in FIG. 5, located at the vertical ends of the electronic module 200. The flanges 610 extend horizontally in their longitudinal direction when mounted on the wall 110. The flanges 610 are arranged in parallel and adjacent to the second surface area 210a. The flanges 610 have a first surface 611, facing away from the second surface area 210a. Further the flanges 610 have a second surface 612a, facing the second surface area 210a and are adjacent with a third surface 612b. The third surface 612b is perpendicular to the second surface 612a. The first surface 611 and the second surface 612a, adjoined form the flanges 610 which has a fourth surface 613. Two attachment means 620a, 620b here are attached horizontally to the first surface area 110a as shown in FIG. 5. The attachment means 620a, 620b are arranged e.g. on the first surface area 110a such that a receiving side of the attachment means 620a, 620b face each other. The receiving side comprises a semi-closed cavity 630 and a flange opening 640 on the attachment means 620a, 620b as shown in FIG. 6. Further the receiving side has a left side opening 698 and a right side opening 699 to receive the flanges 610 as shown in FIG. 5. Thus the flange opening 640 of the respective attachment means 620a, 620b face each other. The attachment means 620a, 620b are arranged at a third distance ds with respect to each other, and are arranged to receive the flanges 610 of the electronic module 200 e.g. from the right side opening 699 as shown in FIG. 5. The third distance ds is the distance between the attachment means 620a, 620b when the flanges 610 of the electronic module 200 can be longitudinally entered either from the left side opening 698 or the right side opening 699 of the attachments means 620a, 620b; into the flange opening 640 whereby a snug contiguous fit is formed between the flanges 610 and an inside of the flange opening 640. In other words, the third distance ds is the distance between the two fourth surfaces 613 of the electronic module 200. The attachment means 620a, 620b are a three legged fork shaped rib, with a first and a second fork leg 621 and 622 respectively forming the semi-closed cavity 630. The semi-closed cavity 630 may receive the fixing means 650 either from the left side opening 698 or the right side opening 699 of the attachment means 620a, 620b. A third fork leg 623 is attached to the first surface area 110a. The flanges 610 are guided into the flange opening 640 e.g. between the second fork leg 622 and the third fork leg 623. The flanges 610 of the electronic module 200 are inserted laterally e.g. into the flange opening 640 via the left side opening 698 or the right side opening 699 into the entire length of the attachment means 620a, 620b. The width and depth of the flange opening 640 is enough to accommodate the fourth surface 613 of the fin end 610 creating a substantially contiguous fit as shown embodiment of FIG. 5. The electronic module 200 is held in the attachment means 620a, 620b firmly by the fixing means 650 shown in FIG. 6. An abutment means 651 with e.g. middle section 651c with a rectangular cross section and which is interposed between the first and the second fork leg 621, 622 of the attachment means 620a, 620b. The abutment means 651 is laterally entered into the semi-closed cavity 630 e.g. from either the right side opening 699 or the left side opening 698 of the attachment means 620a, 620b and further the abutment means 651 has a cross-sectional area such that it substantially can only slide laterally inside the cavity 630. The abutment means 651 has two end parts with surfaces 651a, 651b; which are inclined with respect to the middle section 651c of the rectangular cross-section of the abutment means 651. In other words the abutment means 651 have tapered end parts. Further two wedge shaped fasteners 652a and 652b are entered into the cavity 630 from both the right side opening 699 and the left side opening 698, to engage/abut the two tapered surfaces 651a, 651b. The wedge shaped fasteners 652a and 652b have a hallow middle that is adapted to receive a fastening rod 653. Once the wedge shaped fasteners 652a, 652b are mounted on the fastening rod 653 and are contiguously touching the tapered surfaces 651a, 651b; the bolting means 654 e.g. a nut can be used to fasten the fastening rod 653 so as to immobilize the fixing means 650 inside the semi-closed cavity 630. Thus it results in that the electronic module 200 is fastened with the wall 110 wherein the flanges 610 are sandwiched between the second leg 622 and the third leg 623. The fastening rod 653 may be placed in parallel to the abutment means 651 or may run through a hollow middle in the abutment means 651. Thus the fixing means 650 is adapted to transfer heat from the electronic module 200 coupled via the attachment means 620a, 620b to the wall 110a.

Figure 7:
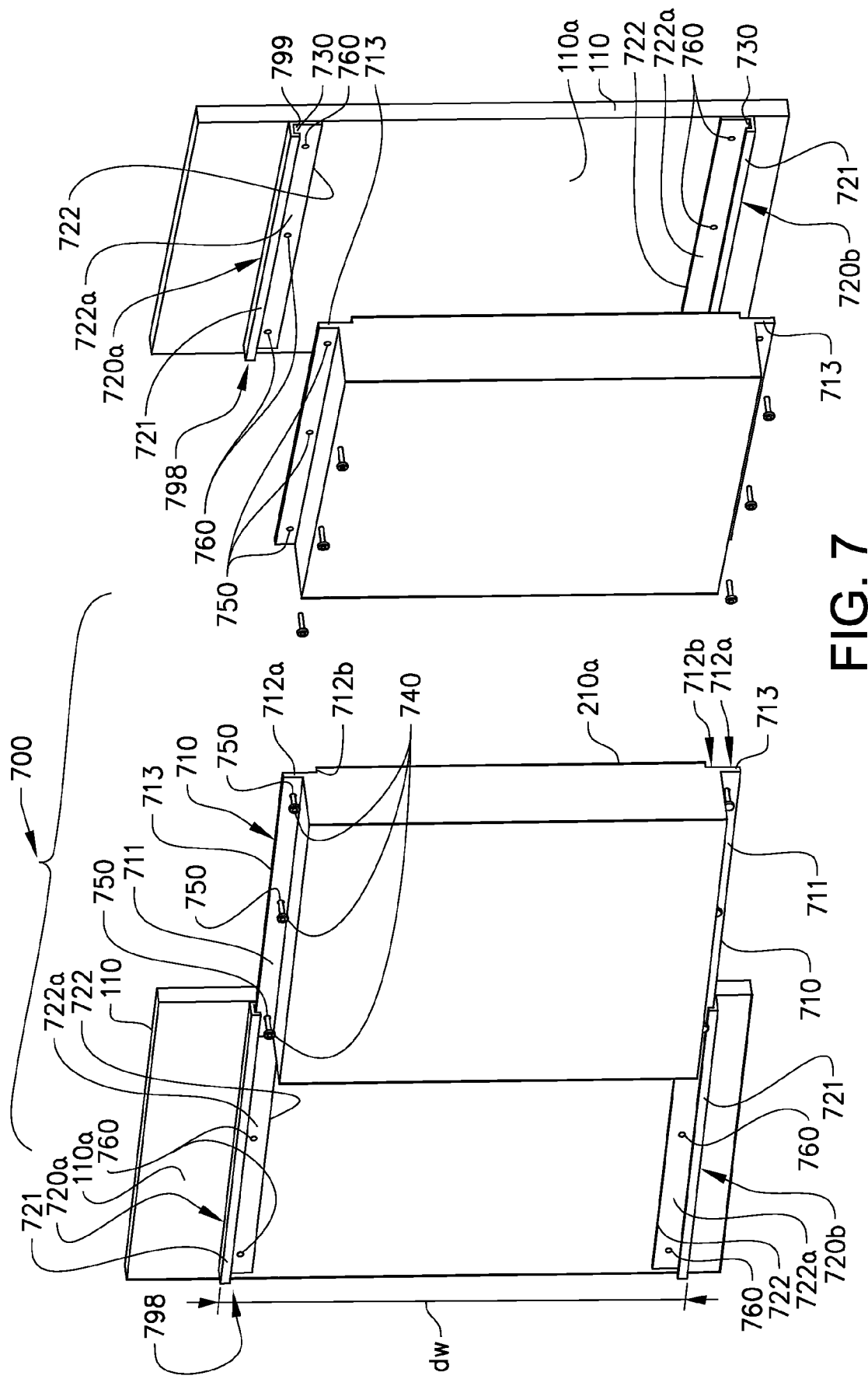
FIG. 7 shows an alternative embodiment of the wall with the attachment means and the fixing means configuration.
Figure 8:
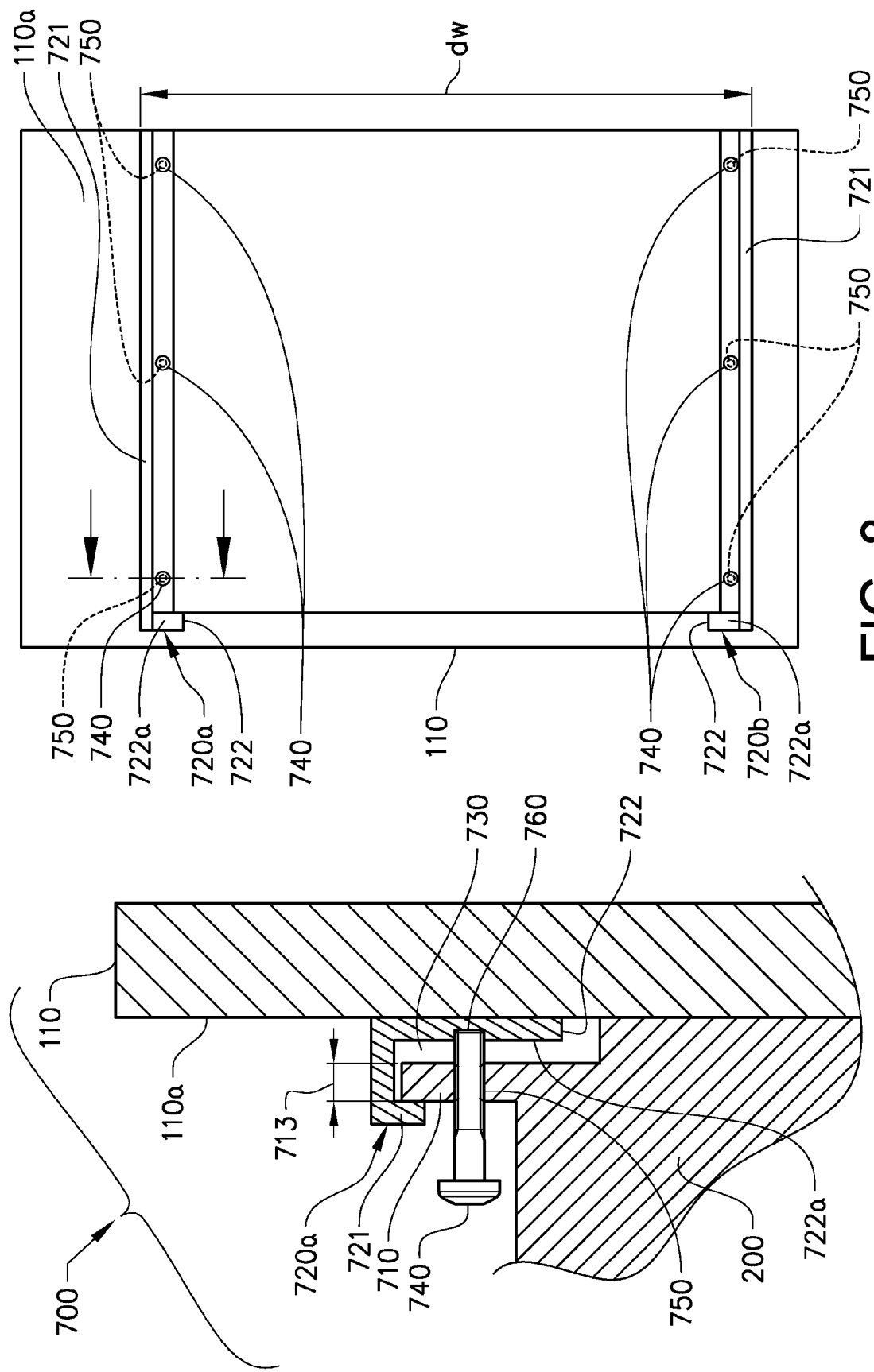
FIG. 8 shows a more detailed layout of the embodiment in FIG. 8.

In another embodiment 700 shown in FIG. 7, the electronic module 200 may have two fin shaped ends or flanges 710. The flanges 710 can longitudinally extend horizontally when in a mounted position to the vertically standing wall as shown in FIG. 7, located at ends seen as an upper end and a lower end of the electronic module 200 in FIG. 7. The flanges 710 are arranged in parallel and adjacent to the second surface area 210a. The flanges 710 have a first surface 711, facing away from the second surface area 210a. Further the flanges 710 have a second surface 712a having a perpendicular in the same direction as the second surface area 210a and further the second surface 712a being adjacent with a third surface 712b. The third surface 712b is perpendicular to the second surface 712a. The first surface 711 and the second surface 712a, adjoined form the flanges 710 which has a fourth surface 713. Here the electronic module 200 is substantially similar to embodiment 600 discussed earlier but with the distinction that the flanges 710 have a groove/openings or a through-hole 750 built. Two attachment means 720a, 720b are arranged e.g. on the first surface area 110a such that a receiving side of the attachment means 720a, 720b face each other. A receiving side comprises a flange opening 730 on the attachment means 720a, 720b as shown in FIG. 7. Further the receiving side has a left side opening 798 and a right side opening 799, to receive the flanges 710 as shown in FIG. 7 and FIG. 8. The attachment means 720a, 720b are arranged at a fourth distance dw with respect to each other and are arranged to receive the flanges 710 of the electronic module 200 e.g. from the right side opening 799 as shown in FIG. 7. The fourth distance dw i.e. similar to the third distance ds from FIG. 5 and FIG. 6, in that the fourth distance dw is the distance between the attachment means 720a, 720b when e.g. the flanges 710 of the electronic module 200 can be longitudinally entered either from the left side opening 798 or the right side opening 799 of the attachment means 720a, 720b; into the flange opening 730 whereby a snug contiguous fit is formed between the flanges 710 and an inside of the flange opening 730. In other words, the fourth distance dw is the distance between the two fourth surfaces 713 of the electronic module 200. The attachment means 720a, 720b are U-shaped or a two legged shaped rib, with a first leg 721 and a second leg 722 forming the flange opening 730. The second leg 722 is attached to the first surface area 110a. The flanges 710 of the electronic module 200 are inserted laterally into the attachment means 720a, 720b as described earlier. The flanges 710 are guided into the flange opening 730 e.g. formed between the first leg 721 and the second leg 722. The width and depth of the flange opening 730 is enough to accommodate the fourth surface 713 of the flanges 710 creating a contiguous fit as shown in FIG. 8. The electronic module 200 in held in the attachment means 720a, 720b firmly by the fixing means 740 such as screws, bolts etc. The bolts are as a first step entered via the through-hole 750 on the flanges 710 and as a second step entered into the attachment means 130. The attachment means 130 is a cylindrical cavity 760 having a threaded surface area around an axial of the cylindrical cavity 760; further the cylindrical cavity 760 has an opening toward the first surface area 110a of the wall 110. The cylindrical cavity 760 maybe a threaded bore which schematically is shown in left part of FIG. 8. The cylindrical cavity 760 is situated on the surface 722a of the second leg 722 as shown in the left part of the FIG. 8. The surface 722a thus faces the second surface 210a; namely area defined by the second surface 712a and the third surface 712b. The cylindrical cavity 760 is adapted to receive the fixing means 740 via the opening; wherein the fixing means 740 is fitted around the axial, and is resiliently retained by the threaded surface area of the cylindrical cavity 760. Thus the fixing means 740 is adapted to transfer heat from the electronic module 200 coupled via the attachment means 720a, 720b to the wall 110.

Figure 4:
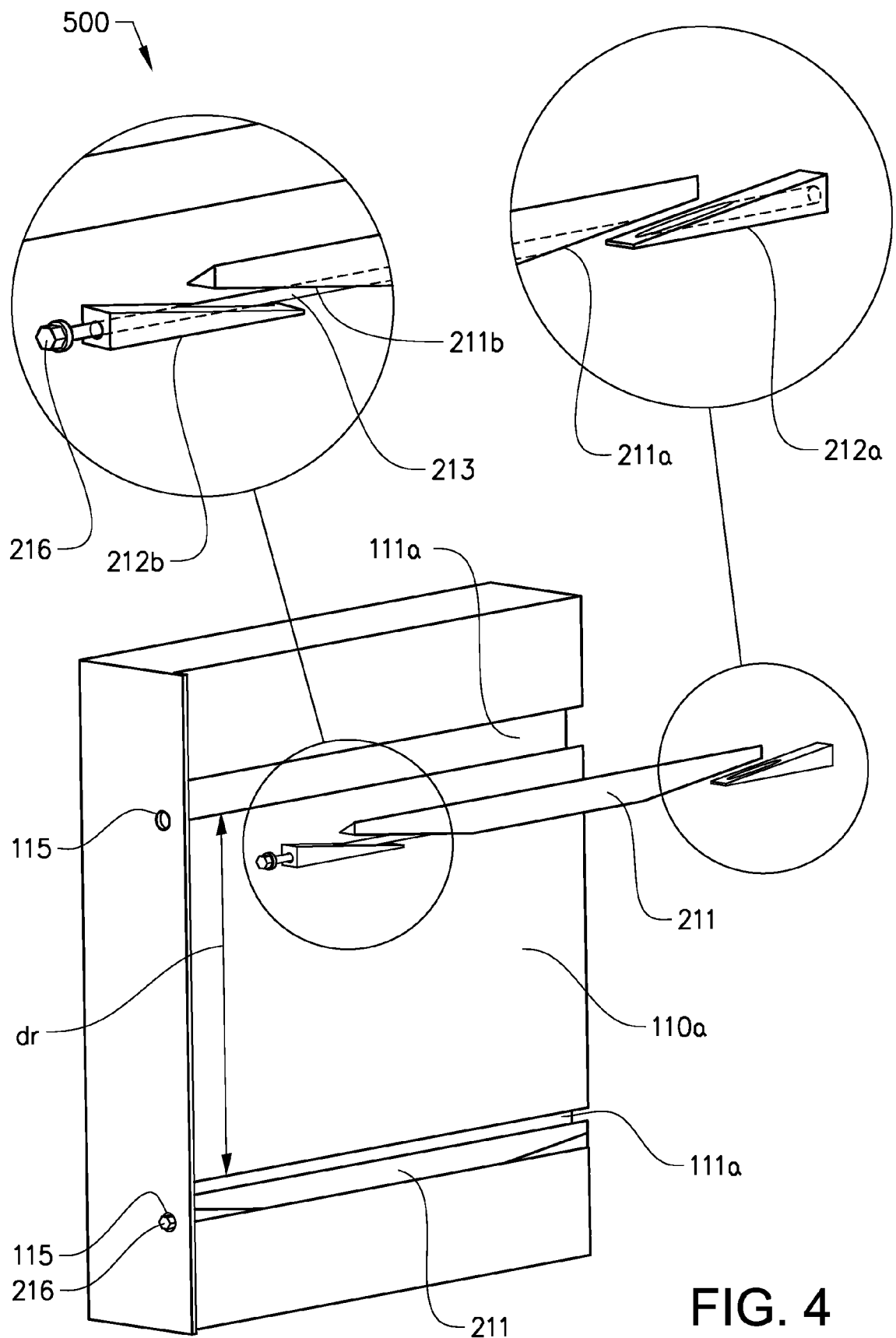
FIG. 4 shows an embodiment of the wall with an attachment means and a fixing means configuration.
Figure 9:
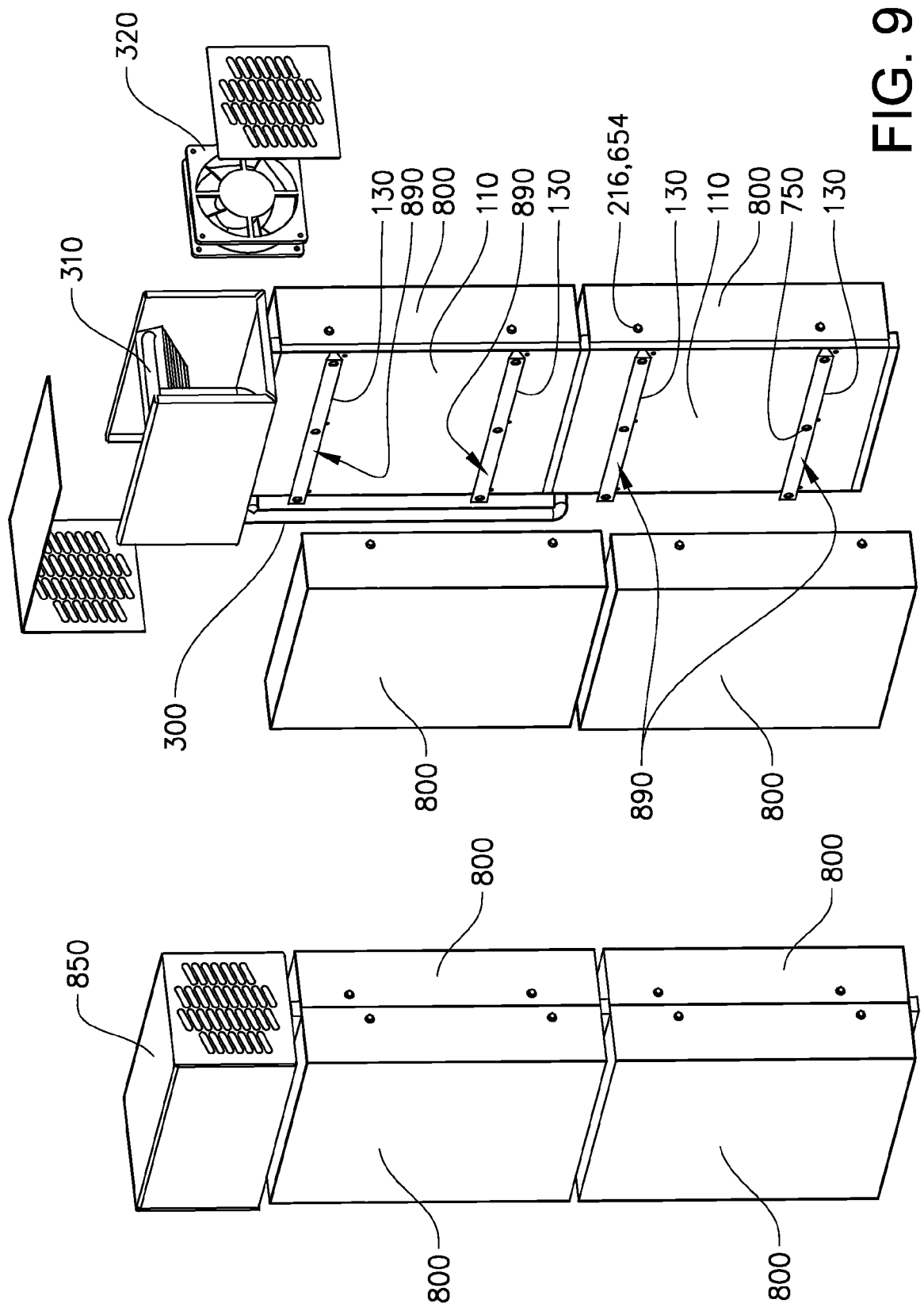
FIG. 9 shows an embodiment with a housing arrangement and an alternative embodiment with the attachment means and the fixing means configuration.

The embodiments of 500, 600, and 700 described in conjunction with FIGS. 4-8 can be housed in housing arrangement as shown in FIG. 9. Open rectangular covers 800 can be used to cover directly the mounting structure 100. The screws/bolts 216, 654 as shown in FIGS. 4 and 9 can be fastened to the wall 110 coupled via the rectangular covers 800 for fast and easy assembly of the housing arrangement. In another alternative embodiment to the embodiments described in conjunction with FIGS. 4-6, the fixing means 890 may be a rod with a triangular cross-section with multiple through-holes 750 for attaching the electronic modules 200.

The connection between the attachment means 130 and the fixing means as described above is arranged so as to create an immediate connection pressure area between the first surface area 110a and second surface area 210a for a transfer of the heat energy from the electronic module 200 to the mounting structure 100. The immediate connection pressure area creates a critical area for thermal loss. The critical area for thermal loss is the thermal interface that has the thermal conductivity around 3 W/m/K. The heat conduction is primarily around the critical areas surrounding and in proximity to e.g. the fixing means 740 in the embodiment 700. So in other words, the critical areas that get the immediate connection pressure. The temperature fall in Kelvin over one of these critical areas is $$\Delta T = P \times d / (A \times k) \quad \text{(Equation 1)}$$

where
P is the power in Watt/W. A value of 200 W is assumed here as an example.
d is the thickness of thermal interface in meters/m. 0.1 mm is here assumed.
A is the area of the thermal interface in m². The area is here assumed to cover a radius of 30 mm around the screw.
k is thermal conductivity of the thermal interface in W/m/K. A typical value is 3.

With the assumptions above will the temperature loss around one screw be:

$$\Delta T = 200 \times 0.0001 / (0.03^2 \times \pi \times 3) = 2.4 \text{ K}$$

These 2.4 Kelvin per screw is acceptable if the budget for the full system is 15 K i.e. that 6 screws are required to have the above budged thermal loss.

Similarly, for the embodiment described in conjunction with FIG. 2 and FIG. 3 with the inbuilt recesses 111a in the wall 110; a connection with the rivets, similar immediate connection pressure areas create the critical area for thermal loss in that heat energy can transfer from the electronic module 200 to the mounting structure 100. For embodiment 500, the critical areas for thermal heat transfer are from the electronic module 200 to the fixing means 211 to interior surface for the attachment means 130 e.g. the negative recesses 111a. In embodiment 600, the critical areas for thermal heat transfer are from the flanges 610 to the third leg 623 and further onto the first surface area 110a. In embodiment 700, the critical areas for thermal heat transfer are from the flanges 710 and the screws 740 to the cavities 750 on the second leg 722 and further onto the first surface area 110a.

In an embodiment, the cavity means 120 may be a cylindrical tube made of the thermal conductive material such as the extruded metal described earlier and numerous such cylindrical tubes may be mounted in the back side of the wall 110 such that the cylindrical tubes are e.g. embedded vertically at the distance dc behind the first surface area 110a. In another embodiment, the cavity means 120 may be formed as a result of cavity formation in the wall 110. Further the cavity means 120 are arranged substantially parallel with respect to the first surface area 110a as shown in FIG. 2. In another embodiment, the cylindrical tubes may be embedded horizontally at the distance (i.e. dc) behind the first surface area 110a and further are arranged substantially parallel with respect to the first surface area 110a.

The cavity means may have a cross-sectional area that is substantially circular, square, or triangular.

In an embodiment, the cooling means 300 e.g. is a thermosyphon loop comprising a cooling device 320; a condenser 310; and a cooling medium 330 adapted to circulate in the cavity means 120 and the condenser 310, the cooling medium 330 adapted to be cooled in the condenser 310 by the cooling device 320. In an embodiment the cooling device 320 is an electric fan. The cavity means 120 with the cooling means 300 forms e.g. an evaporator channel for removing heat energy from the wall 110.

All electronic modules 200 when attached to the wall 110 are cooled i.e. the second surface area 210 via thermal conduction mechanism. Each electronic module 200 must have physical contact with a sufficient part of the wall 110 through its second surface area 210 so that a heat transfer interface is created. The width and size of the mounting structure 100 can be very flexible and differ depending on the need from different types of the electronic module 200. Special distribution modules could be used. These distribution modules are used for distributing power, control and/or data buses. The distribution modules can have direct module-to-module connectors on its sides. The distribution modules are connected and disconnected to each other by sliding along the recesses 111a. The need for internal cables is thereby reduced. Alternatively can U-shape patch connectors be used. Thus different shaped or sized modules can be connected in a flexible manner.

As much as practically possible of the heat that is produced within the electronic module 200 has to be transferred to the heat-interface in the back i.e. the second surface area 210a. All "Hot-spots" shall then naturally be placed as close to the back as possible facing the first surface area 110a. A good material of choice is aluminium, which is fairly inexpensive, has low density and good thermal conductivity. Magnesium could also be considered as a lightweight alternative in dry conditions. Other thermal conductive material can be used. Either the electronic module may be located inside a box made of aluminium or at least the electronic module's back side is made of aluminium. Further backup battery modules for use during power blackouts or shortages can also be placed in a book-shelf type of structure that is hanged on the wall 110.

In an embodiment, a heat interface material or a thermal interface material (TIM) can be used between the metallic contact surfaces i.e. between the first surface area 110 and the second surface area 210, in order to increase the thermal conductivity transfer flow between the respective surfaces. The heat interface material could be a tape, a grease material or a plurality of pads e.g. sheet of heat conductive material e.g. a ceramic filled polymer material. The heat interface material is preferably placed on the electronic module 200 e.g. the second surface area 210 or on the first surface area 110a since the cooling requirements might differ with different types of electronic module 200 and that it would not add extra costs for small partly equipped configurations for arrangements of such electronic modules 200 on the wall 110.

Figure 10:
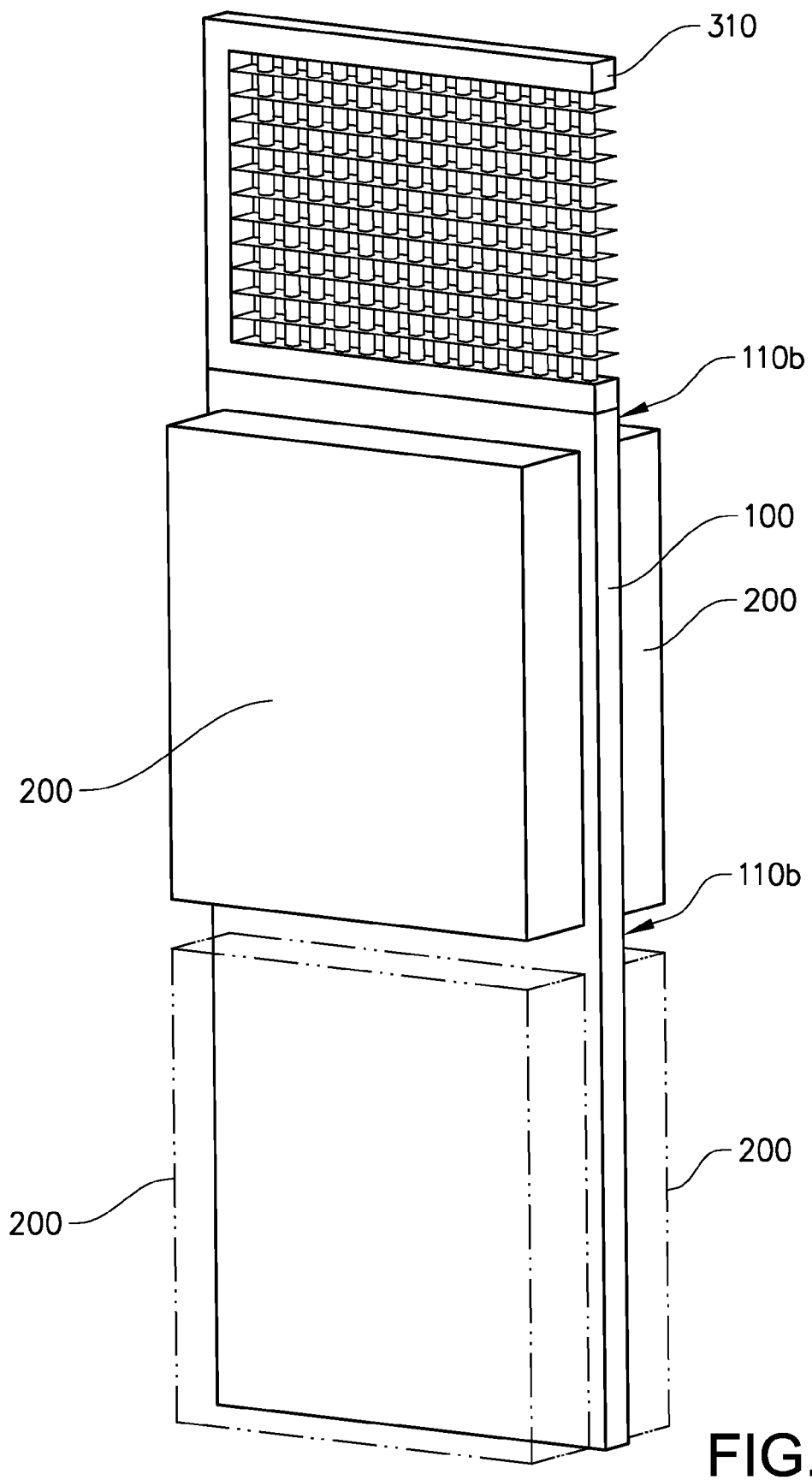
FIG. 10 shows a particular embodiment of attaching an electronic module on the wall.

In an embodiment a sandwich structure can be arranged e.g. with two first surface areas 110a, 110b; on the wall 110 i.e. back and front side of the wall 110 for mounting of the electronic module 200 as shown in FIG. 10. The evaporator channels are then e.g. placed in the middle between the front and the back side of the wall 110 as shown in FIG. 2. These evaporator channels can be vertical or horizontal with respect to the wall 110, where the wall 110 further may have imbedded cooling pipes for supply of the cooling medium 330 in the thermosyphon loop.

Figure 11A:
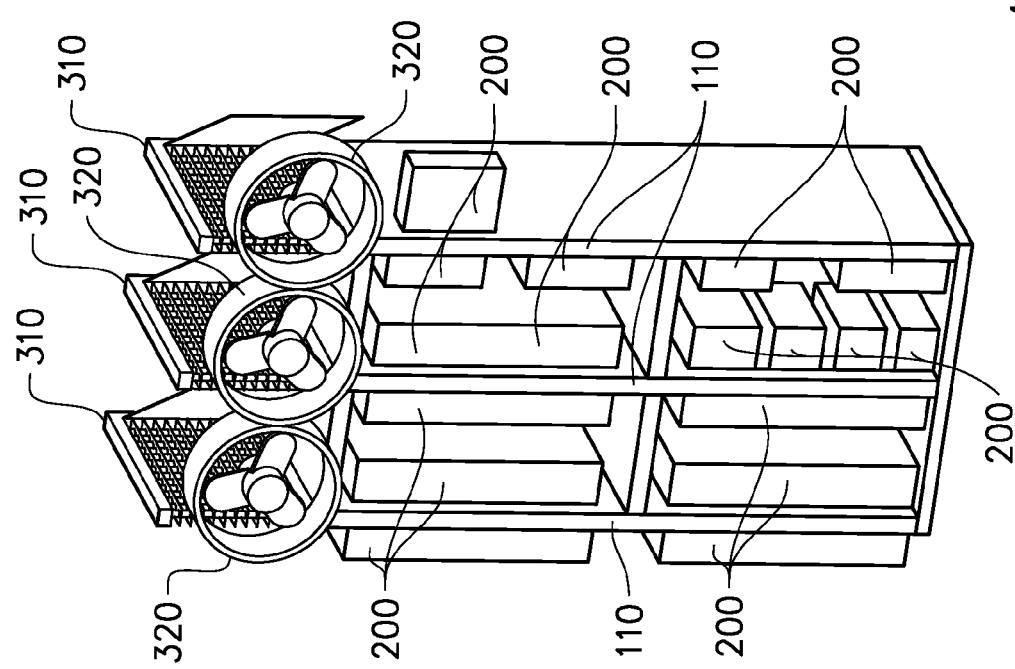
FIG. 11a shows an alternative embodiment of attaching the electronic module on the wall.
Figure 12:
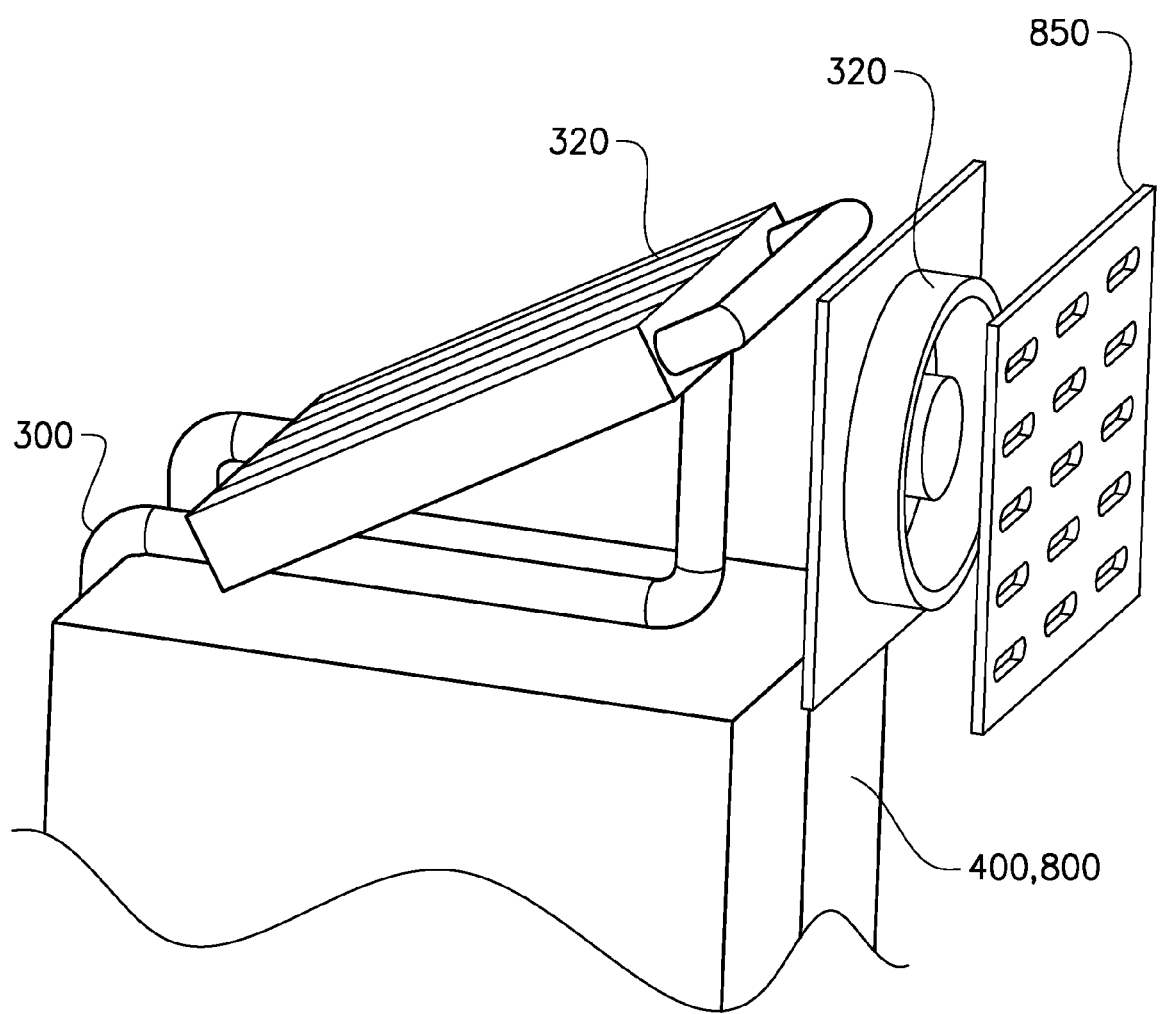
FIG. 12 shows a particular embodiment of a condenser and a cooling device.
Figure 13:
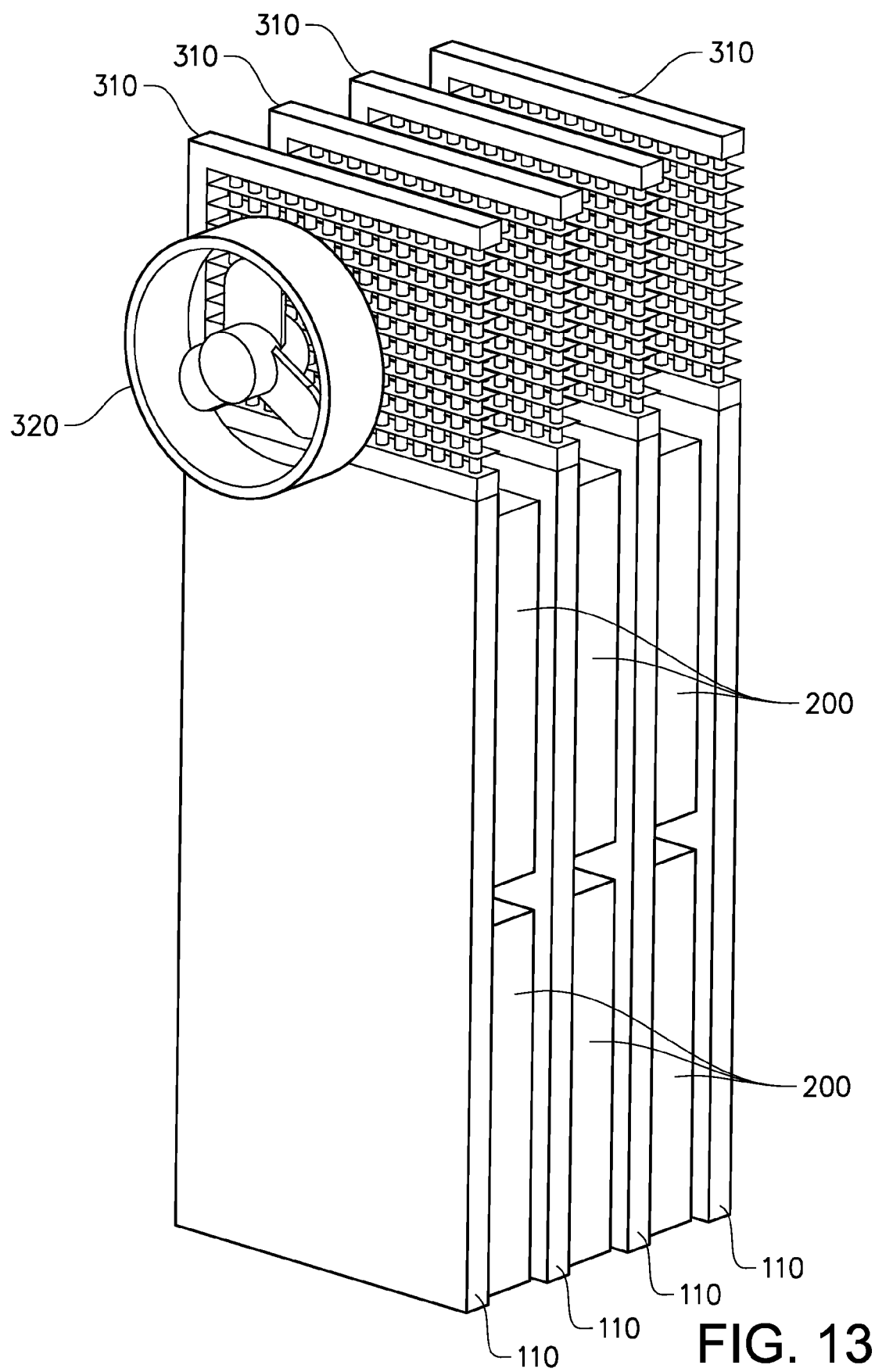
FIG. 13 shows an alternative embodiment of the condenser and the cooling devices for a multiple wall and the electronic module configuration.

Multiple walls 110 can be arranged in parallel formation for mounting of the electronic modules 200 as shown in FIG. 11a and FIG. 13. In another embodiment, one single wall 110 can be used for mounting of the electronic module 200 as shown in FIG. 11b. The choice of the wall 110 depends on the restrictions on the volume available for its placement in the RBS-H 400. The condenser 310 may be of rectangular shape as shown in FIG. 11b and FIG. 13 with different configurations. In another embodiment, the condenser 310 can be single W or ridged or corrugated shaped e.g. cooled by multiple cooling devices 320, as shown in FIG. 11a and FIG. 12. Typically the condenser 310 and the cooling device 320 are situated outside the RBS-H 400. The condenser 310 and the cooling device 320 maybe protected from external elements such dust and rain by a cover 850 as shown in FIG. 9 and FIG. 14. In another embodiment 900, the condenser functionality provided in a closed air system comprising a two dimensional array of heat conducting rods 910 and the cooling device 320 are situated inside the RBS-H 400 as shown in FIG. 16. The heat generated by a printed board assembly (PBA) 920 will be removed by combination of the cooling device 320 and the heat conducting rods 910 to a back wall 930 of the RBS-H 400. As the wall 110 and the back wall 930 are intimately connected, the wall 110 thus functions as a heat sink.

In an embodiment, the wall 110 has a number of parallel vertical evaporation channels. The flow in each of the evaporation channel is only dependent of the heat load. If there is no heat transferred in to the evaporation channel there will be minimal or no circulation of the cooling media inside the channel. The wall is therefore self-adjusting and adaptive to the actual cooling needed in certain areas of the wall 110. The total flow is only dependent on the total heat load. The condenser 310 is air-cooled and e.g. is placed outside the RBS-H 400, which is described in a section further down.

In an embodiment, the electronic module 200 is a radio base station or a network server or work-station or a high-power rectifier that generate heat. In another embodiment, the electronic module 200 is a circuit board with an electro-magnetic configuration. In another embodiment the electronic module 200 may comprise a modular case and the PBA.

Figure 15B:
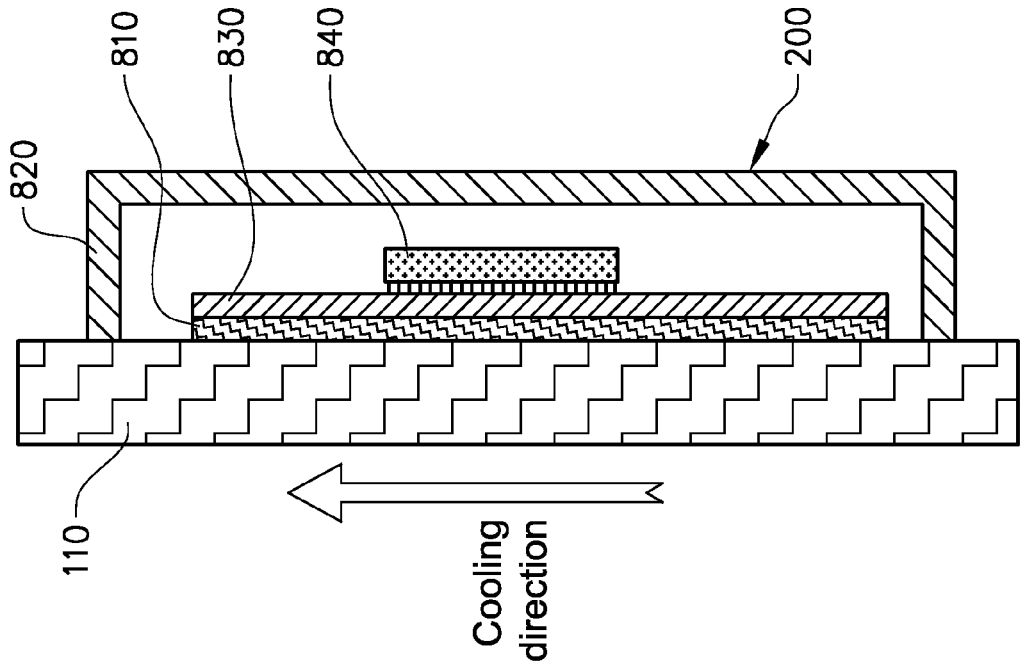
Figure 15A:
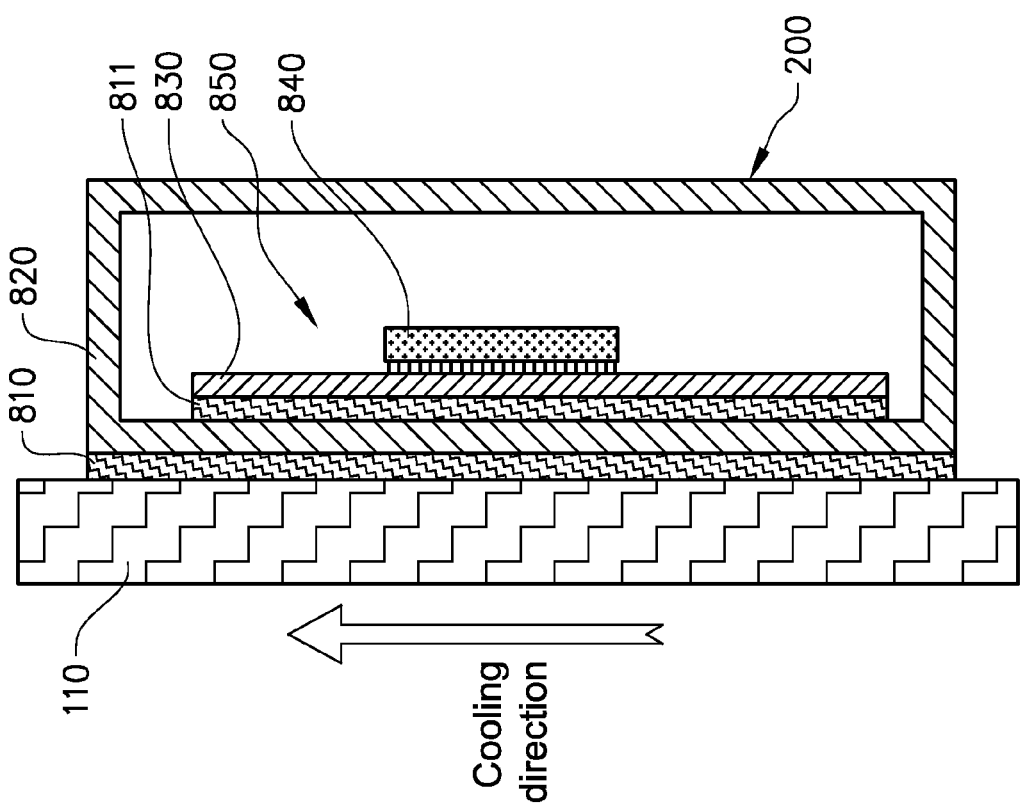
FIG. 15a shows an embodiment using a TIM material and a printed circuit board as layers for heat transfer between the electronic module and the wall.

In an embodiment, the RBS-H 400 is adapted to comprise the mounting structure 100 and the electronic module 200. In another embodiment, the RBS-H 400 may comprise the second surface area 210a of the electronic module 200 that is adapted to engage with the first surface area 110a via the TIM. An exemplary embodiment is shown in FIG. 15a, where a first TIM layer 810 is interposed between the wall 110 and electronic module 200. The electronic module 200 may further have a second TIM layer 811 interposed between the modular wall 820 and a PBA 850; the PBA 850 further comprises a printed circuit board 830 and an electronic component 840. In another embodiment, the RBS-H 400 may comprise the electronic module 200 that is adapted to engage with the first surface area 110 via the printed circuit board. In another embodiment, the RBS-H 400 may comprise that the printer circuit board 830 is adapted to engage with the first surface area 110 via the TIM 810 as shown in FIG. 15b. In the RBS-H 400, several walls 110 can be placed together in parallel stacks. The walls 110 can be arranged or connected together in a pivotable manner. The evaporator channels to and from the condenser 310 could then be placed in rotating joints and thereby also serve as hinges without reducing cooling capacity. In an embodiment, the RBS-H 400 may have an opening in a front portion for receiving the mounting structure 100 and/or the electronic module 200 as shown in FIG. 11b. In another embodiment there can be an opening in the top portion of the RBS-H 400 for receiving the mounting structure 100 and/or the electronic module 200 from above as shown in FIG. 14.

Main advantages enabled by at least one of the disclosed embodiments are (a) a compact solution with no need for air-channels and additional heat-exchangers; (b) a cost efficient solution; (c) power efficient and self-regulating solution with small energy required for the cooling system; (d) no pumps or moving parts in the vapour/liquid based system; (e) a closed sealed vapour/liquid based system with low risk for leakages and (f) decoupling a volume need from a cooling need.

The invention claimed is:

1. A method for assembling a radio base station housing arrangement, the arrangement comprising:
   a housing,
   an electronic module for one of a radio base station, a network server, a workstation, a high-power rectifier, and a circuit board with an electro-magnetic configuration,
   a heat conducting mounting structure for mounting the electronic module, said heat conducting mounting structure comprising:
      at least one first surface area of a wall, the first surface area positioned to face a second surface area of the electronic module;
      at least one cavity embedded in the wall, the cavity being placed at a distance from the first surface area;
      at least one mount at the first surface area that attaches to the electronic module and secures the electronic module to the wall, the at least one mount also transfers heat energy from the electronic module to the heat conducting mounting structure, wherein the at least one mount comprises at least one fixing member and a connection between the at least one mount and the fixing member is arranged so as to create an immediate connection pressure area between the first and second surface area for a transfer of the heat energy from the electronic module to the heat conducting mounting structure;
   an enclosed loop that extends through the at least one cavity and contains a cooling material that cools the cavity;
   the method comprising inserting the heat conducting mounting structure from a top opening of the housing and positioning a first portion of the loop within the housing and a second portion of the loop outward above the housing.

2. The method according to claim 1, further comprising attaching the electronic module to the heat conducting mounting structure before the heat conducting mounting structure is inserted into the housing.

3. The method according to claim 1, wherein the first surface area of the heat conducting mounting structure is parallel to the second surface area.

4. The method according to claim 1, wherein the first surface area of the heat conducting mounting structure is planar.

5. The method according to claim 1, wherein the first surface area of the heat conducting mounting structure is ridged or corrugated.

6. The method according to claim 1, wherein the mount comprises positive or negative recesses adapted to receive the electronic module.

7. The method according to claim 1, wherein the mount comprises a cylindrical cavity having:
   a threaded surface area around an axis of the cylindrical cavity;
   an opening toward the first surface area of the wall;
   the cylindrical cavity being adapted to receive a fixing member via the opening; wherein the fixing member is resiliently retained by the threaded surface area of the cylindrical cavity.

8. The method according to claim 1, wherein the fixing member is a rivet attachable to the electronic module.

9. The method according to claim 1, wherein the fixing member is one of a clamp, a screw, a hook, and a quarter-turn screw.

10. The method according to claim 1, wherein the fixing member is adapted to engage the second surface area onto the first surface area.

11. The method according to claim 1, wherein the cavity is a cylindrical tube.

12. The method according to claim 1, wherein the first surface area is arranged substantially vertical.

13. The method according to claim 1, wherein the loop is a thermosyphon loop to cool the at least one cavity, the thermosyphon loop comprising a cooling device positioned outside of the housing.

14. The method according to claim 13, wherein the cooling device is an electric fan.

15. The method according to claim 1, wherein the first surface area includes a thermal conductive material.

16. The method according to claim 15, wherein the thermal conductive material is one of an extruded aluminum, an extruded copper, an iron-nickel compound, and a graphite material.

17. The method according to claim 1, wherein the housing is adapted to engage with the first surface area via a thermal interface material.

18. The method according to claim 1, wherein the electronic module is adapted to engage with the first surface area via a printed circuit board.

19. The method according to claim 18, wherein the printed circuit board is adapted to engage with the first surface area via a thermal interface material.

\* \* \* \* \*